(12) United States Patent
Waku

(10) Patent No.: US 10,357,938 B2
(45) Date of Patent: Jul. 23, 2019

(54) CARBON-FIBER-REINFORCED PLASTIC STRUCTURE

(75) Inventor: Hiroyuki Waku, Tokyo (JP)

(73) Assignee: MITSUBISHI HEAVY INDUSTRIES, LTD., Tokyo (JP)

(*) Notice: Subject to any disclaimer, the term of this patent is extended or adjusted under 35 U.S.C. 154(b) by 501 days.

(21) Appl. No.: 13/982,295

(22) PCT Filed: Feb. 8, 2012

(86) PCT No.: PCT/JP2012/052845
§ 371 (c)(1),
(2), (4) Date: Jul. 29, 2013

(87) PCT Pub. No.: WO2012/111503
PCT Pub. Date: Aug. 23, 2012

(65) Prior Publication Data
US 2013/0316128 A1    Nov. 28, 2013

(30) Foreign Application Priority Data

Feb. 16, 2011    (JP) .................................. 2011-030886

(51) Int. Cl.
*B32B 5/12*    (2006.01)
*B32B 5/26*    (2006.01)
(Continued)

(52) U.S. Cl.
CPC .................. *B32B 5/12* (2013.01); *B32B 3/06* (2013.01); *B32B 5/26* (2013.01); *B32B 7/08* (2013.01); *B32B 27/12* (2013.01); *B64C 3/185* (2013.01); *B64C 3/20* (2013.01); *B64D 43/00* (2013.01); *H05K 1/0366* (2013.01); *H05K 3/4602* (2013.01); *H05K 3/4632* (2013.01); *B29L 2031/3076* (2013.01);
(Continued)

(58) Field of Classification Search
CPC .... B32B 5/12; B32B 5/26; B32B 7/08; B32B 27/12; B32B 3/06; B32B 2260/021; B32B 2262/106; B32B 2307/206; B32B 2307/714; B32B 2605/18; B64C 3/185; B64C 3/20; B64D 43/00; B29L 2031/3076; Y10T 428/24132
USPC ................................................ 428/114, 688
See application file for complete search history.

(56) References Cited

U.S. PATENT DOCUMENTS 5,874,152 A * 2/1999 Middelman ........... B29B 15/122
156/166
2004/0190274 A1    9/2004 Saito et al.
2008/0047742 A1    2/2008 Samejima et al.

FOREIGN PATENT DOCUMENTS

EP    2 083 609    7/2009
JP    09-193296    7/1997
(Continued)

OTHER PUBLICATIONS

Kash, J., et al., Optical PCB Overview, Nov. 2009, IBM Corporation, Slides 1-17, retrieved from: http://www-03.ibm.com/procurement/proweb.nsf/objectdocswebview/filepcb+-+ibm+opcb+roadmap+and+technology+-+jeff+kash.pdf/$file/ibm+opcb+roadmap+and+tech+jeff+kash.pdf.*

(Continued)

*Primary Examiner* — Brian Handville
(74) *Attorney, Agent, or Firm* — Wenderoth, Lind & Ponack, L.L.P.

(57) ABSTRACT

A spar (2) is formed by stacking a signal-line layer (52), which includes a resin layer (521) having a plurality of signal lines (522) embedded therein, on a carbon-fiber prepreg (51).

19 Claims, 3 Drawing Sheets

(51) Int. Cl.
  B32B 7/08    (2019.01)
  B32B 27/12   (2006.01)
  B32B 3/06    (2006.01)
  B64C 3/18    (2006.01)
  B64C 3/20    (2006.01)
  B64D 43/00   (2006.01)
  H05K 1/03    (2006.01)
  H05K 3/46    (2006.01)
  B29L 31/30   (2006.01)
  H05K 1/11    (2006.01)

(52) U.S. Cl.
  CPC ... *B32B 2260/021* (2013.01); *B32B 2262/106* (2013.01); *B32B 2307/206* (2013.01); *B32B 2307/714* (2013.01); *B32B 2605/18* (2013.01); *H05K 1/115* (2013.01); *H05K 2201/0195* (2013.01); *H05K 2201/029* (2013.01); *H05K 2201/0323* (2013.01); *H05K 2201/10121* (2013.01); *Y10T 428/24132* (2015.01)

(56) References Cited

FOREIGN PATENT DOCUMENTS

| | | |
|---|---|---|
| JP | 2004-87856 | 3/2004 |
| JP | 2006-24640 | 1/2006 |
| JP | 2007-288055 | 11/2007 |
| JP | 2009-302459 | 12/2009 |
| JP | 2010-80486 | 4/2010 |
| WO | 2010/058443 | 5/2010 |

OTHER PUBLICATIONS

Machine Translation of JP 2007-288055. 2007.*
Machine Translation of JP 2006-024640. 2006.*
wiseGEEK.org, What is Resin?, Nov. 19, 2012, obtained from https://web.archive.org/web/20121119100012/http://www.wisegeek.org/what-is-resin.htm.*
Machine Translation of JP 2006-024640 from espacenet.com. 2006.*
International Search Report dated Apr. 17, 2012 in International (PCT) Application No. PCT/JP2012/052845 with English translation.
Written Opinion of the International Searching Authority dated Apr. 17, 2012 in International (PCT) Application No. PCT/JP2012/052845 with English translation.
Extended European Search Report dated Nov. 8, 2016 in corresponding European patent application No. 12746610.0.

* cited by examiner

CARBON-FIBER-REINFORCED PLASTIC STRUCTURE

BACKGROUND OF THE INVENTION

1. Technical Field

The present invention relates to a carbon-fiber-reinforced plastic structure in which a resin layer is stacked on the surface of a carbon-fiber prepreg.

2. Description of the Related Art

Conventionally, structures such as primary wings of an aircraft are generally formed of a metal member such as an aluminum alloy member. However, recently, from the viewpoint of a decrease in weight or an increase in strength, so-called composite materials such as carbon-fiber-reinforced plastics (hereinafter, abbreviated as "CFRP") are widely used as the materials of such structures (for example, see Japanese Unexamined Patent Application, First Publication No. H9-193296).

Specifically, a carbon-fiber-reinforced plastic structure (hereinafter, abbreviated as a "CFRP structure") having a predetermined shape is formed by heating a carbon-fiber prepreg in which a plurality of sheets having a thermosetting resin infiltrated into a carbon fiber are stacked and curing the thermosetting resin. In the CFRP structure, a so-called resin layer is formed on the surface thereof by the thermosetting resin seeping from the carbon fiber at the time of heating the carbon-fiber prepreg.

Where an electronic device is installed on the surface of the CFRP structure, a signal line connected to the electronic device is generally arranged to extend on the surface of the CFRP structure.

SUMMARY OF THE INVENTION

1. Problem to be Solved by the Invention

However, in the conventional CFRP structure, since signal line is arranged to extend on the surface thereof, the configuration of the structure is complicated and the structure increases in size by the thickness of the signal lines. Since the signal line is exposed on the surface of the CFRP structure, the signal line is likely to be damaged due to contact with external objects and the appearance of the CFRP structure is damaged.

The present invention is made in consideration of the above-mentioned circumstances and an object thereof is to provide means for enabling an electronic device to be mounted on a CFRP structure without causing signal lines to extend on the surface thereof.

2. Means for Solving the Problem

A carbon-fiber-reinforced plastic structure according to the present invention includes a carbon-fiber prepreg and a signal-line layer stacked on the carbon-fiber prepreg, wherein the signal-line layer includes a resin layer and a plurality of signal lines embedded in the resin layer.

According to this configuration, since the signal lines are embedded in the resin layer and are not exposed on the surface of the CFRP structure, it is possible to simplify the CFRP structure and to reduce the size thereof. It is also possible to prevent the signal lines from being damaged due to contact with external objects. It is also possible to prevent the appearance of the CFRP structure from being damaged due to exposure of the signal lines.

In the carbon-fiber-reinforced plastic structure according to the present invention, ports connected to the signal lines through the signal-line layer may be disposed in the middle of the signal lines.

According to this configuration, signals input to the signal lines can be drawn out to the outside via the ports connected to the signal lines, even though the signal lines are not exposed on the surface of the CFRP structure.

In the carbon-fiber-reinforced plastic structure according to the present invention, the signal lines may be arranged with a gap corresponding to a frequency of an input signal.

According to this configuration, since electrostatic capacitance (so-called C) formed between the neighboring signal lines decreases with an increase in the gap between the signal lines and increases with a decrease in the gap, it is possible to maintain electric resistance at a useful frequency, for example, by reducing the value of C with an increase in the useful frequency.

Since the neighboring signal lines are separated from each other by the gap corresponding to the frequency of an input signal, it is possible to prevent a problem with electromagnetic interference in that a signal line is affected by electromagnetic waves generated from the neighboring signal lines thereof to generate noise in the signal.

3. Effects of the Invention

By employing the carbon-fiber-reinforced plastic structure according to the present invention, it is possible to mount an electronic device on the CFRP structure without causing signal lines to extend on the surface thereof. Accordingly, it is possible to simplify the CFRP structure and to reduce the size thereof. It is also possible to prevent the signal lines from being damaged due to contact with external objects. It is also possible to prevent the appearance of the CFRP structure from being damaged due to exposure of the signal lines on the surface of the CFRP structure.

DETAILED DESCRIPTION OF THE INVENTION

First Embodiment

Hereinafter, embodiments of the present invention will be described with reference to the accompanying drawings. First, the configuration of a CFRP structure according to a first embodiment of the present invention will be described. A member constituting a primary wing of an aircraft will be described as an example of the CFRP structure.

Figure 1:
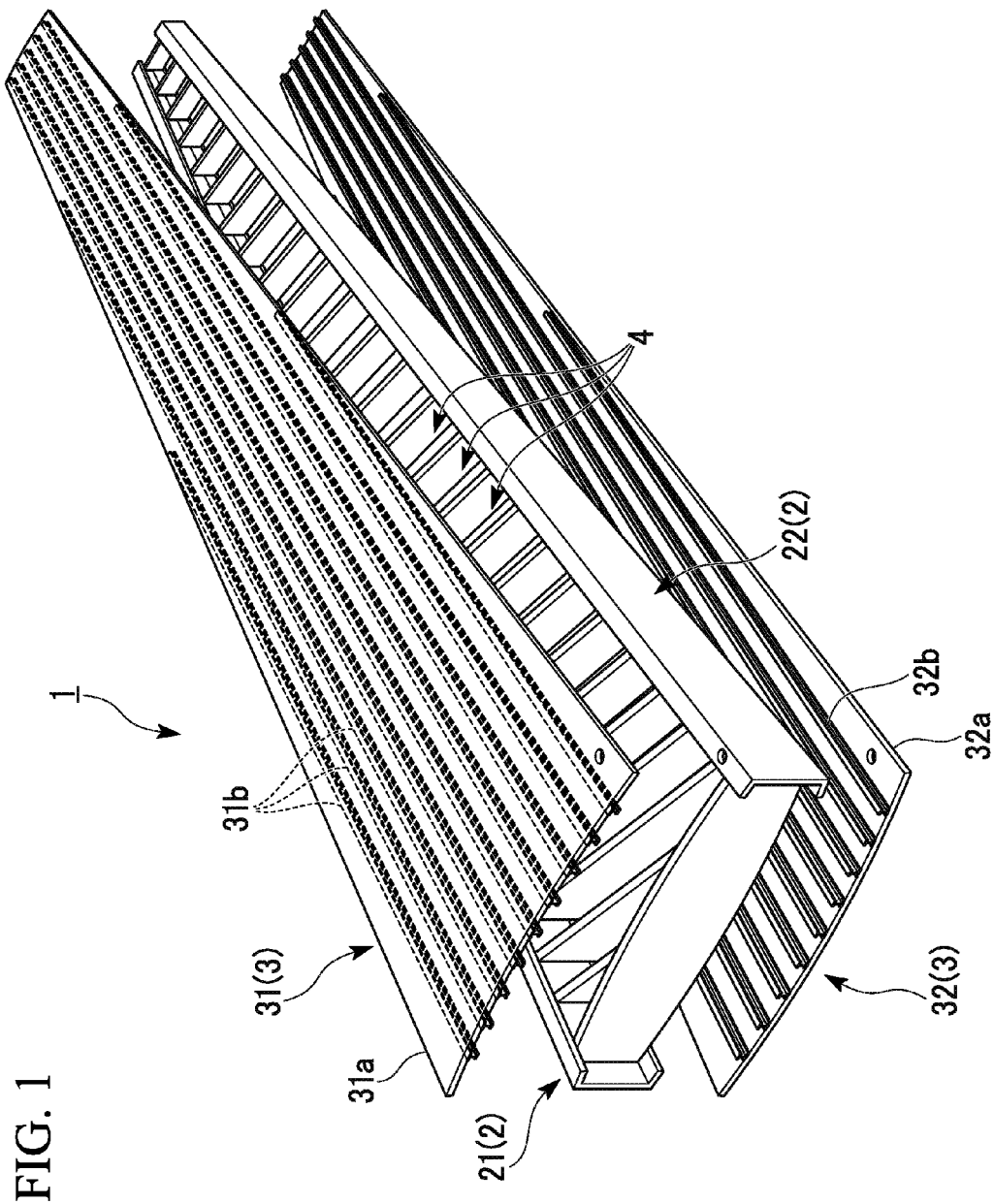
FIG. 1 is an exploded perspective view schematically illustrating a primary wing according to a first embodiment of the present invention.

FIG. 1 is an exploded perspective view schematically illustrating the configuration of a primary wing 1. The primary wing 1 includes a pair of spars 2 forming both side portions along the longitudinal direction, a pair of panels 3 forming a top surface and a bottom surface, and a plurality of ribs 4 disposed therein.

As shown in FIG. 1, the pair of spars 2 includes a front spar 21 constituting a side portion on the front side of an aircraft out of both side portions of the primary wing 1 and a rear spar 22 constituting a side portion on the rear side of the aircraft. The pair of spars 2 having this configuration is disposed with a predetermined gap therebetween so that each opening thereof faces each other. Both the front spar 21 and the rear spar 22 are members formed by shaping a carbon-fiber-reinforced plastic (CFRP).

As shown in FIG. 1, the pair of panels 3 includes a top panel 31 constituting the top surface of the primary wing 1 and a bottom panel 32 constituting the bottom surface thereof. The top panel 31 includes a plate-like top skin 31a having a curved cross-sectional shape and a plurality of stringers 31b disposed on one surface of the top skin 31a so as to enhance the bending stiffness of the top skin 31a. The top skin 31a and the stringers 31b are also members formed by shaping a carbon-fiber-reinforced plastic. Similarly, the bottom panel 32 includes a bottom skin 32a and a plurality of stringers 32b, and both are also members formed by shaping a carbon-fiber-reinforced plastic.

The plurality of ribs 4 structurally reinforce the primary wing 1. As shown in FIG. 1, the ribs 4 are arranged with a predetermined gap in the longitudinal direction of the primary wing 1 and one end of each rib 4 is connected to the front spar 21 and the other end thereof is connected to the rear spar 22. Accordingly, the front spar 21 and the rear spar 22 are maintained with a constant gap. The ribs 4 are members formed of metal.

Figure 2:
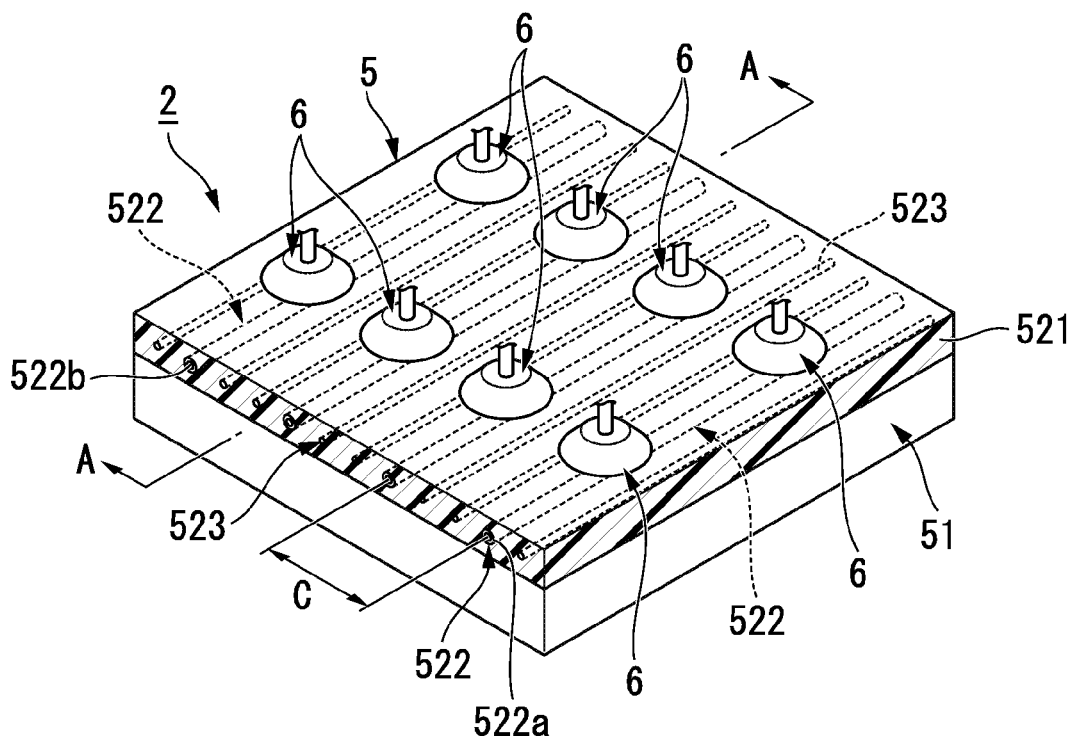
FIG. 2 is a perspective view schematically illustrating a part of a spar according to the first embodiment.
Figure 3:
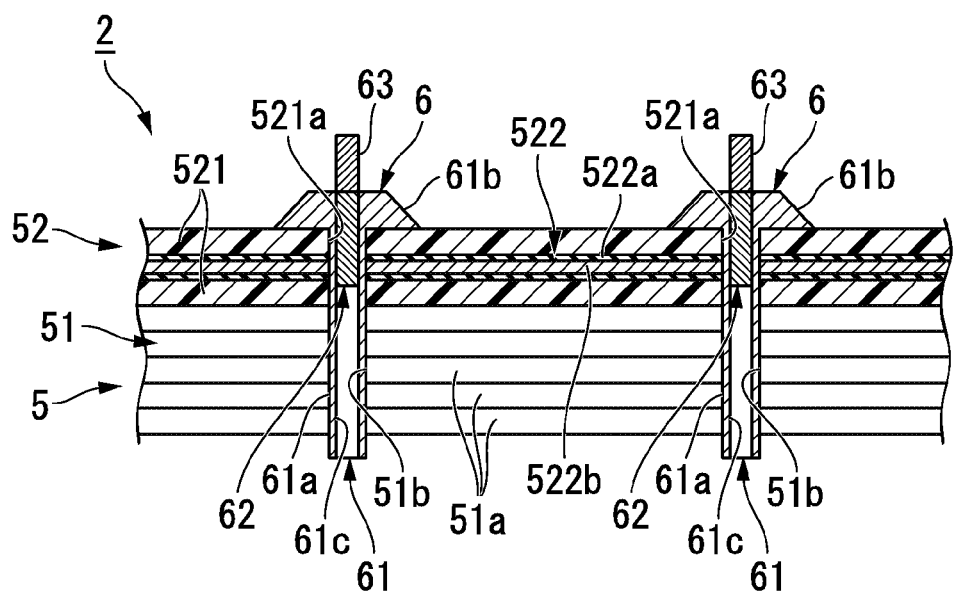
FIG. 3 is a cross-sectional view schematically illustrating a cross-section taken along line A-A of FIG. 2.

FIGS. 2 and 3 are diagrams illustrating a spar 2 as the CFRP structure according to the first embodiment, where FIG. 2 is a perspective view schematically illustrating a part of the spar 2 and FIG. 3 is a cross-sectional view schematically illustrating a cross-section taken along line A-A of FIG. 2.

As shown in FIGS. 2 and 3, the spar 2 includes a spar body 5 formed of CFRP and a plurality of ports 6 detachably attached to the spar body 5.

As shown in FIG. 3, the spar body 5 includes a layered carbon-fiber prepreg 51 and a signal-line layer 52 stacked on the surface of the carbon-fiber prepreg 51.

As shown in FIG. 3, the carbon-fiber prepreg 51 is formed by stacking a plurality of sheets 51a in which a thermosetting resin (not shown) is made to seep into carbon fiber and curing the thermosetting resin to unify the sheets 51a. Here, the carbon-fiber prepreg 51 made of carbon fiber has conductivity. As shown in FIG. 2, a plurality of port insertion holes 51b are formed in the carbon-fiber prepreg 51 so as to correspond to the positions of signal lines 522 to be described later. The port insertion holes 51b serve to insert the ports 6 therethrough and are formed with a predetermined gap along the extending direction of the signal lines 522 so as to pass through the carbon-fiber prepreg 51.

As shown in FIGS. 2 and 3, the signal-line layer 52 includes a resin layer 521 disposed so as to cover the surface of the carbon-fiber prepreg 51, a plurality of signal lines 522 embedded in the resin layer 521, and reinforcing fibers 523 embedded in the resin layer 521 between the signal lines 522.

The resin layer 521 is formed by stacking the thermosetting resin seeping from the carbon fiber at the time of curing the thermosetting resin on the surface of the carbon-fiber prepreg 51. The resin layer 521 made of the thermosetting resin is an insulator not having conductivity. As shown in FIG. 3, a plurality of port attachment holes 521a are formed in the resin layer 521 so as to correspond to the positions of the signal lines 522. The port attachment holes 521a are used to attach the ports 6 thereto and are formed to pass through the resin layer 521 with substantially the same gap as the port insertion holes 51b along the extending direction of the signal lines 522. Accordingly, the port attachment holes 521a communicate with the port insertion holes 51b located on the lower side thereof.

The plurality of signal lines 522 are electrical lines connected to an electronic device not shown so as to supply power thereto. As shown in FIG. 2, the signal lines 522 have a configuration in which a copper wire 522a is covered with an insulator 522b such as a fluorine resin and are arranged to be parallel to each other with a predetermined gap C. The signal lines 522 are not disposed in the port attachment holes 521a formed in the resin layer 521. In a part of signal lines 522 extending in the opposite directions with the corresponding port 6 interposed therebetween, one end of the copper wire 522a is exposed to the inside of the port attachment holes 521a.

The material, the cross-sectional shape, the length, the number, and the like of the signal lines 522 are not limited to this embodiment and can be appropriately changed in design. Although details are not shown, the signal lines 522 according to the present invention are not limited to the electric lines according to this embodiment but, for example, optical fiber transmitting electrical signals input to an electronic device and output from the electronic device may be used. Where the optical fiber is employed as the signal lines 522, the optical fiber having superior heat resistance can be suitably used so as not to degrade at the time of heating the carbon-fiber prepreg 51.

The plurality of reinforcing fibers 523 reinforce the resin layer 521 to suppress deformation of the signal lines 522 as much as possible. The reinforcing fibers 523 are linear fiber glass (glass fibers). As shown in FIG. 2, two reinforcing fibers 523 are disposed with a predetermined gap between the neighboring signal lines 522 so as to extend in a direction substantially parallel to the signal lines 522.

The cross-sectional shape, the length, the number, and the like of the reinforcing fibers 523 are not limited to this embodiment but can be changed in design depending on the thickness of the resin layer 521 or the shape of the signal lines 522. The material of the reinforcing fibers 523 is not limited to the fiber glass according to this embodiment, but any member having superior resistance to bending or torsion can be used. The reinforcing fibers 523 are not constituents essential to the present invention, and the signal-line layer 52 may be constructed by the resin layer 521 and the plurality of signal lines 522.

The plurality of ports 6 are electrodes for drawing out signals input to the signal lines 522 to the outside. As shown in FIG. 3, each port 6 includes a bolt-like support 61, a port body 62 supported by the support 61, and a signal drawing line 63 of which one end is connected to the port body 62 and the other end is drawn out to the outside of the support 61.

As shown in FIG. 3, in the support 61, an umbrella-like head portion 61b is formed at one end of a rod-like shaft portion 61a and an insertion hole 61c is formed to pass through the shaft portion 61a and the head portion 61b. Here, the shaft portion 61a is formed so that the outer diameter thereof is substantially equal to the inner diameter of the port attachment holes 521a and the port insertion holes 51b and the length thereof is slightly larger than the thickness of the spar body 5. The head portion 61b is formed so that the outer diameter thereof is larger than the inner diameter of the port attachment holes 521a.

As shown in FIG. 3, the port body 62 has a cross-sectional shape substantially inserted into the port attachment hole 521a of the resin layer 521. The port body 62 is inserted into the insertion hole 61c formed through the support 61 and is supported at the position of the support 61 close to the base end of the shaft portion 61a, that is, at the position close to the head portion 61b.

As shown in FIG. 3, in the port 6 having this configuration, the shaft portion 61a of the support 61 is inserted into the port attachment hole 521a and the port insertion hole 51b up to the position at which the bottom surface of the head portion 61b comes in contact with the surface of the resin layer 521. At this time, the port body 62 supported by the shaft portion 61a of the support 61 is located inside the port attachment hole 521a and a pair of signal lines 522 extending to both sides with the port body 62 interposed therebetween is connected to the port body 62. That is, the copper line 522a passing through the signal line 522 comes in contact with the port body 62. Accordingly, it is possible to draw out a signal input to the signal line 522 from the port body 62 to the outside via the signal drawing line 63.

The operational effects of the spar 2 as the CFRP structure according to the first embodiment will be described below. In the spar 2 according to the first embodiment, a plurality of signal lines 522 connected to an electronic device are embedded in the resin layer 521 stacked on the surface of the carbon-fiber prepreg 51. Accordingly, since the signal lines 522 are not exposed on the surface of the spar 2, it is possible to simplify the configuration of the spar 2 and to reduce the size thereof. It is also possible to prevent the signal lines 522 from being damaged due to contact with external objects (not shown). It is also possible to prevent the appearance of the spar 2 from being damaged due to exposure of the signal lines 522.

Since the ports 6 passing through the signal-line layer 52 and coming in contact with the signal lines 522 are provided, it is possible to draw out a signal input to the signal lines 522 embedded in the resin layer 521 via the ports 6. The ports 6 are detachably attached to the spar body 5. Accordingly, where there are a plurality of types of devices to which the signal drawn out from the signal lines 522 should be input, the ports 6 can be replaced with ports corresponding to the devices.

Since the neighboring signal lines 522 are separated from each other with a gap C corresponding to the frequency of an input signal, it is possible to prevent a problem with electromagnetic interference in that a signal line 522 is affected by electromagnetic waves generated from the neighboring signal lines 522 to generate noise in the signal.

Second Embodiment

The configuration of a CFRP structure according to a second embodiment of the present invention will be described below. In this embodiment, members constituting a primary wing of an aircraft will be described as an example of the CFRP structure.

The primary wing according to the second embodiment includes a pair of spars 2, a pair of panels 3, and a plurality of ribs 4, similar to the primary wing according to the first embodiment shown in FIG. 1.

Figure 4:
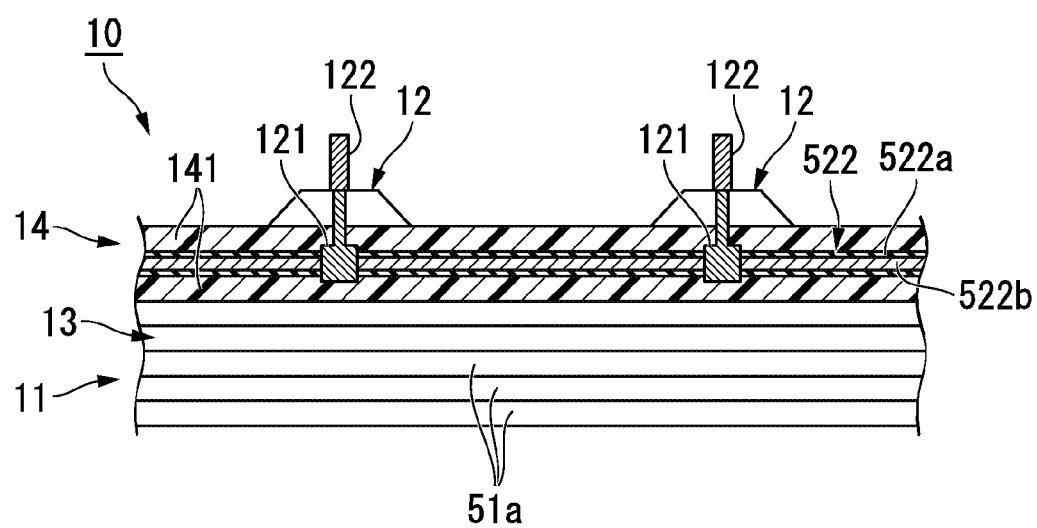
FIG. 4 is a cross-sectional view schematically illustrating a spar according to a second embodiment.

FIG. 4 is a cross-sectional view schematically illustrating a spar 10 according to the second embodiment. The spar 10 according to this embodiment includes a spar body 11 made of a CFRP and a plurality of ports 12 which are fixed to the spar body 11 so as not to be detachable therefrom.

As shown in FIG. 4, the spar body 11 is the same as the spar body 5 according to the first embodiment shown in FIG. 3, in that a signal-line layer 14 is stacked on the surface of a layered carbon-fiber prepreg 13. However, the spar body 11 is different from the spar body 5 according to the first embodiment, in that the port insertion holes 51b are not formed in the carbon-fiber prepreg 13 and the port attachment holes 521a are not formed in the resin layer 141 constituting the signal-line layer 14. The other configuration of the spar body 11 is the same as described in the first embodiment. Accordingly, the same reference numerals as shown in FIG. 3 are used in FIG. 4 and a description thereof will not be repeated here.

As shown in FIG. 4, each of the plurality of ports 12 includes a port body 121 embedded in the resin layer 141 and a signal drawing line 122 of which one end is connected to the port body 121 and the other end is drawn out to the outside of the support 61.

The port body 121 is an electrode made of titanium or corrosion-resistant steel and is used to draw out a signal input to the corresponding signal line 522 to the outside. In this specification, corrosion-resistant steel means alloy steel of which resistance to corrosion is improved to be superior to stainless steel by optimizing the amount of chromium, molybdenum, nickel, or the like. As shown in FIG. 4, the port body 121 is embedded in the resin layer 141 constituting the signal-line layer 14, is fixed to the spar body 11 so as not to be detachable therefrom, and comes in contact with the copper line 522a passing through the signal line 522. Accordingly, it is possible to draw out a signal input to the signal line 522 from the port body 121 to the outside via the signal drawing line 122.

The operational effects of the spar 10 as the CFRP structure according to the second embodiment will be described below. In the spar 10 according to the second embodiment, the plurality of signal lines 522 connected to an electronic device are embedded in the resin layer 141 stacked on the surface of the carbon-fiber prepreg 13.

Accordingly, the same effects as the spar 2 according to the first embodiment, that is, the simplification in configuration and the reduction in size of the spar 10, the prevention of damage to the signal lines 522, and the improvement in appearance, can be achieved.

Since the ports 12 embedded in the resin layer 141 and coming in contact with the signal lines 522 are provided, it is possible to draw out a signal input to the signal lines 522 embedded in the resin layer 141 via the ports 12. The ports 12 are fixed to the spar body 11 so as not to be detachable therefrom. Accordingly, since the copper wires 522a passing through the signal lines 522 and the ports 12 are brought into satisfactory contact with each other and are supported in this state, it is possible to accurately and reliably draw out the signal input to the signal lines 522 to the outside.

By making the port body 121 out of titanium or corrosion-resistant steel, the port body 121 is not likely to be rusted even when the port body 121 fixed to the spar body 11 is present inside the resin layer 141 for long periods of time. Accordingly, it is possible to more accurately and surely drawn out the signal input to the signal lines 522 to the outside.

In the above-mentioned embodiments, the spars 2 and 10 constituting the primary wing 1 of an aircraft are described as an example of the CFRP structure. However, the CFRP structure is not limited to the spars 2 and 10 and may be used, for example, as the top skin 31a and the stringers 31b constituting the top panel 31 shown in FIG. 1, or the bottom skin 32a and the stringers 32b constituting the bottom panel 32. The CFRP structure is not limited to the constituent of the primary wing 1 of an aircraft, but may be a constituent of an arbitrary structure.

Various shapes or combinations or operation sequences of the constituent members described in the above-mentioned embodiments are only an example, and can be modified in various forms depending on requirements in design without departing from the concept of the present invention.

In the carbon-fiber-reinforced plastic structure according to the present invention, since the signal lines are embedded in the resin layer and are not exposed on the surface of the CFRP structure, it is possible to simplify the configuration of the CFRP structure and to reduce the size thereof. It is also possible to prevent the signal lines from being damaged due to contact with external objects. It is also possible to prevent the appearance of the CFRP structure from being damaged due to exposure of the signal lines.

REFERENCE SIGNS LIST

1: primary wing
2: spar (first embodiment)
3: panel
4: rib
5: spar body
6: port
10: spar (second embodiment)
11: spar body
12: port
13: carbon-fiber prepreg
14: signal-line layer
21: front spar
22: rear spar
31: top panel
32: bottom panel
51: carbon-fiber prepreg
52: signal-line layer
61: support
62: port body
63: signal drawing line
121: port body
122: signal drawing line
141: resin layer
521: resin layer
522: signal line
523: reinforcing fiber
31a: top skin
31b: stringer
32a: bottom skin
32b: stringer
51a: sheet
51b: port insertion hole
521a: port attachment hole
522a: copper wire
522b: insulator
61a: shaft portion
61b: head portion
61c: insertion hole
C: gap

The invention claimed is:

1. A carbon-fiber-reinforced plastic structure comprising:
a carbon-fiber prepreg formed by stacking a plurality of carbon-fiber reinforced sheets;
a signal-line layer stacked on a first surface of the carbon-fiber prepreg; and
reinforcing fibers,
wherein the signal-line layer includes a thermosetting resin layer and a plurality of signal lines embedded in the thermosetting resin layer,
wherein the reinforcing fibers are disposed so as to extend in a first direction parallel to each of the signal lines when viewed from a side of the first surface of the carbon-fiber prepreg, and
wherein the thermosetting resin layer is in contact with the entire opposing surface of the carbon-fiber prepreg.

2. The carbon-fiber-reinforced plastic structure according to claim 1, wherein ports connected to the signal lines through the signal-line layer are disposed in the middle of the signal lines.

3. The carbon-fiber-reinforced plastic structure according to claim 1, wherein the signal lines are arranged with a gap corresponding to a frequency of an input signal.

4. The carbon-fiber-reinforced plastic structure according to claim 2, wherein the signal lines are arranged with a gap corresponding to a frequency of an input signal.

5. The carbon-fiber-reinforced plastic structure according to claim 1, wherein the reinforcing fibers are embedded in the thermosetting resin layer.

6. The carbon-fiber-reinforced plastic structure according to claim 2, wherein the reinforcing fibers are embedded in the thermosetting resin layer.

7. The carbon-fiber-reinforced plastic structure according to claim 3, wherein the reinforcing fibers are embedded in the thermosetting resin layer.

8. The carbon-fiber-reinforced plastic structure according to claim 1, wherein the reinforcing fibers are glass fibers.

9. The carbon-fiber-reinforced plastic structure according to claim 1, wherein the signal lines are electric lines.

10. The carbon-fiber-reinforced plastic structure according to claim 1, wherein the signal lines are optical fibers.

11. The carbon-fiber-reinforced plastic structure according to claim 1, wherein the signal lines are arranged to be parallel to each other with a gap corresponding to a frequency of an input signal.

12. The carbon-fiber-reinforced plastic structure according to claim 1, wherein the signal lines are embedded in the thermosetting resin layer so as to be insulated from each other.

13. The carbon-fiber-reinforced plastic structure according to claim 1, wherein the reinforcing fibers are embedded in the thermosetting resin layer between the signal lines so as to suppress deformation of the signal lines.

14. The carbon-fiber-reinforced plastic structure according to claim 1, wherein the reinforcing fibers are arranged with a predetermined gap between neighboring signal lines of the plurality of signal lines.

15. The carbon-fiber-reinforced plastic structure according to claim 2, wherein:
at least one of the ports includes a port body and a support supporting the port body and formed in an umbrella-like shape; and
a bottom surface of the umbrella-like shape comes in contact with a surface of the thermosetting resin layer.

16. The carbon-fiber-reinforced plastic structure according to claim 15, wherein:
the support is formed in the umbrella-like shape at one end of the support; and
the support is inserted into the signal-line layer to the position at which the bottom surface of the umbrella-like shape comes in contact with a surface of the thermosetting resin layer.

17. A structural component of an aircraft primary wing, the structural component comprising:
- a carbon-fiber prepreg formed by stacking a plurality of carbon-fiber reinforced sheets;
- a signal-line layer stacked on a first surface of the carbon-fiber prepreg; and
- reinforcing fibers,
- wherein the signal-line layer includes a thermosetting resin layer and a plurality of signal lines embedded in the thermosetting resin layer,
- wherein the reinforcing fibers are disposed so as to extend in a first direction parallel to each of the signal lines when viewed from a side of the first surface of the carbon-fiber prepreg, and
- wherein the thermosetting resin layer is in contact with the entire opposing surface of the carbon-fiber prepreg.

18. The carbon-fiber-reinforced plastic structure according to claim 1, wherein the signal lines are arranged to be parallel to each other, and wherein the reinforcing fibers are disposed between neighboring signal lines of the signal lines, the neighboring signal lines being spaced in a second direction along the first surface.

19. The structural component of the aircraft primary wing according to claim 17, wherein the signal lines are arranged to be parallel to each other, and wherein the reinforcing fibers are disposed between neighboring signal lines of the signal lines, the neighboring signal lines being spaced in a second direction along the first surface.

* * * * *